US010319565B2

(12) United States Patent
Bruneau et al.

(10) Patent No.: US 10,319,565 B2
(45) Date of Patent: Jun. 11, 2019

(54) METHOD AND SYSTEM FOR CONTROLLING ION FLUX IN AN RF PLASMA

(71) Applicant: ECOLE POLYTECHNIQUE, Palaiseau (FR)

(72) Inventors: Bastien Bruneau, Paris (FR); Erik Johnson, Paris (FR); Tatiana Novikova, Villebon sur Yvette (FR); Jean-Paul Booth, Boullay les Troux (FR)

(73) Assignee: LE CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 15/307,987

(22) PCT Filed: Apr. 30, 2015

(86) PCT No.: PCT/IB2015/053150
§ 371 (c)(1),
(2) Date: Dec. 5, 2016

(87) PCT Pub. No.: WO2015/166446
PCT Pub. Date: Nov. 5, 2015

(65) Prior Publication Data
US 2017/0084428 A1 Mar. 23, 2017

(30) Foreign Application Priority Data
May 2, 2014 (FR) ...................................... 14 54018

(51) Int. Cl.
*H01J 37/32* (2006.01)
*H01L 21/3065* (2006.01)

(52) U.S. Cl.
CPC .... *H01J 37/32128* (2013.01); *H01J 37/3244* (2013.01); *H01J 37/32091* (2013.01);
(Continued)

(58) Field of Classification Search
None
See application file for complete search history.

(56) References Cited

U.S. PATENT DOCUMENTS 6,162,709 A 12/2000 Raoux et al.
2005/0241768 A1* 11/2005 Kawamura ....... H01J 37/32091
156/345.44
(Continued)

OTHER PUBLICATIONS

Heil, B.G., et al., "On the Possibility of Making a Geometrically Symmetric RF-CCP Discharge Electrically Asymmetric," Journal of Physics D: Applied Physics 41(16), Jul. 24, 2008, 19 pages.
(Continued)

*Primary Examiner* — Shamim Ahmed
(74) *Attorney, Agent, or Firm* — Christensen O'Connor Johnson Kindness PLLC

(57) ABSTRACT

A method for generating an ion flow asymmetry in a capacitively coupled radiofrequency plasma reactor comprising a step for energization of a first electrode by a radiofrequency voltage waveform. The standardized voltage waveform is an approximate waveform with a degree of approximation of a standardized sawtooth radiofrequency function having different rising and falling slopes. The degree of approximation of the approximate waveform and the pressure P of the gas are sufficiently high for causing the appearance of an asymmetry of the ion flows between the ion flow at the first electrode and the ion flow at a second electrode.

19 Claims, 9 Drawing Sheets

(52) U.S. Cl.
CPC ... *H01J 37/32422* (2013.01); *H01J 37/32816* (2013.01); *H01J 2237/332* (2013.01); *H01J 2237/334* (2013.01)

(56) References Cited

U.S. PATENT DOCUMENTS

| | | | | |
|---|---|---|---|---|
| 2006/0124612 | A1* | 6/2006 | Kong | H01J 37/32091 219/121.36 |
| 2007/0264791 | A1* | 11/2007 | Han | C23C 16/045 438/424 |
| 2010/0253224 | A1* | 10/2010 | Marakhtanov | H01J 37/32009 315/111.41 |
| 2015/0228445 | A1* | 8/2015 | Chang | H01J 37/1474 250/396 R |
| 2016/0056026 | A1* | 2/2016 | Naradate | C23C 14/35 204/298.03 |

OTHER PUBLICATIONS

International Search Report dated Jul. 10, 2015, issued in corresponding International Application No. PCT/IB2015/053150, filed Apr. 30, 2015, 2 pages.
Written Opinion of the International Searching Authority dated Jul. 10, 2015, issued in corresponding International Application No. PCT/IB2015/053150, filed Apr. 30, 2015, 9 pages.
Written Opinion of the International Searching Authority dated Jul. 10, 2015, issued in corresponding International Application No. PCT/IB2015/053150, filed Apr. 30, 2015, 11 pages.
International Preliminary Report on Patentability dated Nov. 8, 2016, issued in corresponding International Application No. PCT/IB2015/053150, filed Apr. 30, 2015, 1 page.

* cited by examiner

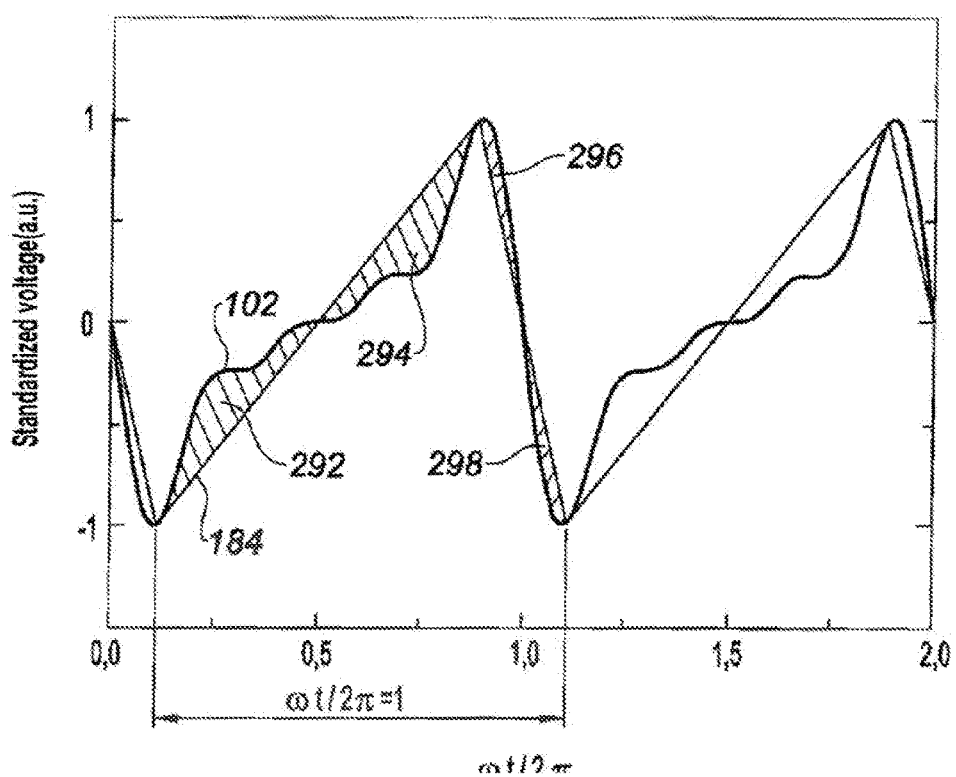

METHOD AND SYSTEM FOR CONTROLLING ION FLUX IN AN RF PLASMA

The present invention relates to a method for controlling ion flows in an RF plasma and to a system for applying the method.

The invention more particularly relates to a method for generating ion flow asymmetry on the electrodes of a radiofrequency plasma reactor coupled capacitively RF-CCP (radio frequency capacitively coupled plasma).

The invention also relates to a plasma treatment method of a substrate using the control of ion flow of the invention.

Plasmas are today massively used in industry, notably in the field of microelectronics and of photovoltaic devices, but also in the textile industry and the plastic industry.

The plasma treatment methods may generally, be divided between the deposition methods, the etching methods and the methods for modifying the surface of a substrate.

The invention may apply to all these types of plasma depositions and to all the industries.

Capacitively coupled radiofrequency plasmas are used in a wide range of industrial methods like the manufacturing of semiconductors or the production of larges surfaces of solar panels. The discharge is applied between two electrodes, a radiofrequency voltage being applied to a first electrode, and a second electrode forming a counter-electrode being of same potential as the walls of the chamber of the reactor, i.e. grounded.

The use of a geometrically asymmetrical plasma reactor chamber, i.e. having two electrodes of different surfaces, gives the possibility of changing the ion flows on the electrodes but is accompanied by a change in energy of the ions. Further, during a transfer towards an industrial reactor, this property is often lost, because of the great size of the reactor which makes its configuration geometrically symmetrical.

In order to remedy this difficulty, the use of a coherent sum of several RF frequency harmonics as an energization source of a plasma.

Thus, the article of B. G. Heil, U. Czanetzki, R. P. Brinkmann, and T. Mussenbrock, entitled "On the possibility of making a geometrically symmetric RF-CCP discharge electrically asymmetric" and published in Journal of Physics D: Applied Physics, Vol. 41, no. 16, p. 165202, August 2008, describes the electrical asymmetry effect (EAE) resulting from the use of a non-sine waveform as a coherent sum of two RF frequency harmonics.

In patent application EP 2 249 372 A1 for which the inventors are the aforementioned authors, a method for electrically inducing an amplitude asymmetry between the electric fields of the sheets of the electrodes exposed to a plasma is described. The energy of the ions is adjusted by establishing a self-biasing voltage facing one of the electrodes by applying an RF voltage having at least two harmonic frequency components with a control of the phase between both frequency components. At least one of the highest frequency components is an even multiple of the lowest frequency component. The method thus gives the possibility of treating with a plasma surfaces of great size of a substrate by adjusting the energy of the ions through the adjustment of the phase between both frequency components.

In both aforementioned documents, the waveforms are selected through the adjustment of the phase for modulating the energy of the ions arriving on an electrode but are not selected for modulating the flows on an electrode relatively to another one.

The use of a trapezoidal voltage waveform is also known for radiofrequency energization of the plasma.

In patent application EP 2 407 998 A1, a method is described for energizing at least one electrode of a capacitively coupled plasma reactor containing a substrate. The electrode is energized by applying an RF voltage with a trapezoidal waveform. The density of the plasma and the flows of the ion and neutral species relatively to the substrate are controlled by adjusting the duration of the rising edge and/or the duration of the falling edge of the trapezoidal waveform. The ion energy distribution function in the vicinity of the substrate may be controlled by adjusting the amplitude and the relative duration between the upper plateau and the lower plateau of the trapezoidal waveform.

Document EP 2 407 998 A1 does not describe the possibility of controlling the flows of ions on each electrode. Nowhere in this document is described or suggested a benefit of using a limited waveform of the trapezoidal waveform wherein the upper and lower plateaus are suppressed and the durations of the rising and falling edges are different.

Finally, it should be noted that the use of a limited waveform of the trapezoidal waveform has already been proposed, in which the upper and lower plateaus are suppressed and the durations of the rising and falling edges are different.

For example this is the case in document U.S. Pat. No. 6,162,709.

However, in this document, this is carried out in order to handle the ion bombardment of the electrodes and not for generating asymmetry of ion flow on these electrodes.

The technical problem is to propose a method for controlling ion flow in a capacitively coupled RF plasma reactor with a given geometry, arbitrary in terms of symmetry and asymmetry, which allows modulation of the ion flows on an electrode relatively to the other one, or of one group of species relatively to the other one, independently of the electric power injected into the plasma.

For this purpose, the object of the invention is a method for generating an ion flow asymmetry in a capacitively coupled radiofrequency plasma reactor, the plasma reactor containing one or several gases mixed under a total pressure P, and including a first electrode, supplied with radiofrequency energy, and a second electrode (26).

The method comprises a step for energizing the first electrode with a periodic radio-frequency voltage waveform V(t) having a lower frequency corresponding to a fundamental harmonic with a fundamental period T of the waveform, and is characterized in that:

the time- and amplitude-standardized voltage waveform over the interval [−1; 1], f(u) is an approximate waveform with a degree of approximation of a standardized sawtooth radiofrequency function $f_{SAW}(u)$, u being the standardized time defined as the ratio of the time t over the fundamental period T; and the standardized sawtooth radiofrequency function has a periodic pattern with a fundamental period T consisting in a first linear portion of time development of the standardized voltage with a first slope p1 immediately followed by a second linear portion of time development of the standardized voltage with a second slope p2 the first and second slopes being of different amplitudes and of opposite signs, the minimum and the maximum of the pattern having the same unit amplitude; and the degree of approximation of the approximate waveform and the total pressure P of the gas or of the gases mixed are sufficiently high so as to cause appearance of an asymmetry of the ion flows between the ion flow at the first electrode and the ion flow at the second electrode.

According to particular embodiments, the method for generating ion flow asymmetry includes one or several of the following features, taken alone or as a combination:

the smallest absolute value from among the absolute value of the first slope p1 and the absolute value of the second slope p2 is less than or equal to a value equal to 3.8 preferably less than or equal to 3;

the periodic radio-frequency voltage waveform V(t) is differentiable and has a slope asymmetry measured by an asymmetry slope factor F parameterized by an integer p greater than or equal to 1 and defined by the equation:

$$F(p) = \left| \frac{\int_{t \in [0,T], V'>0} |(V'(t))^p| - \int_{t \in [0,T], V'<0} |(V'(t))^p|}{\int_{t \in [0,T]} |(V'(t))^p|} \right|$$

V'(t) referring to the derivative of the waveform at instant t, and

F(p) is greater than or equal to a threshold, which threshold depends on the integer p and is equal to 0.1 when p is equal to 2;

the total pressure P of the gas or of the mixed gases is greater than or equal to a threshold pressure value $P_s$(gas), depending on the nature of the gas and defined as the pressure above which an asymmetry of the ion flow clearly appears between the ion flow at the first electrode and the ion flow at the second electrode, when the standardized waveform is a standardized sawtooth function for which the absolute value of the gentlest slope is equal to 2.5 or the asymmetry slope factor F(2) of the waveform V(t) is greater than or equal to 0.1;

the gas is a gas suitable for depositing materials on, for etching, and for modification of a substrate comprised in the set formed by argon, dihydrogen, $O_2$, $Cl_2$, HBr, $CF_4$, $C_4F_8$, $CHF_3$, CO, $SiH_4$, $SiCl_4$, $SiF_4$, $CH_4$, $C_2H_6$ and the carbon chains of same structures, $SF_6$, $Si_2H_6$, $SiH_xF_{4-x}$, $GeH_4$, $GeF_4$, $GeH_xF_{4-x}$, $CCl_4$, $CCl_3F$, $CCl_2F_2$, $CF_3Cl$, $C_2F_6$, $C_3F_8$, $C_5F_8$, $C_5F_{12}$, $CHF_3$, $BCl_3$ and the value of the pressure threshold is equal to 100 mTorrs when the gas is argon;

the approximation degree of the approached waveform is equal to the reciprocal of a functional distance $\underline{d}$ separating the standardized approached voltage waveform f(u) and the radiofrequency standardized sawtooth function $f_{saw}(u)$, the functional distance being comprised in the set formed by the functional distances $L^p$ of Lebesgue, the approximation level being greater than or equal to 1.25, preferably greater than or equal to 2 when the functional distance d is the functional distance d∞, separating the standardized approached waveform and the standardized sawtooth radiofrequency function defined by the analytic expression:

$$d\infty(f(u); f_{SAW}(u)) = \max_{u \in [0,1]} (|f(u) - f_{SAW}(u)|$$

wherein u is the standardized variable defined by $u = \omega t/2\pi$;

the approached voltage waveform after standardization f(u) is a waveform which is not invariant by time reversal, i.e. a waveform for which no real constant τ exists satisfying:
f(u)=f(τ−u), u referring to the standardized time development variable of the standardized approached voltage waveform;

for each maximum current of the standardized approached voltage waveform identified by a travel index j, the duration separating the instant of occurrence t(max(j)) of the maximum current of the instant of occurrence t(min(j)) of the first minimum min(j) according to the maximum current max(j), is different from the duration separating the instant of occurrence t(max(j+1)) of the first maximum max(j+1) immediately following the first minimum min(j) and the instant of occurrence t(min(j)) of the first minimum min(j);

the approached waveform before being standardized is equal to a development of a truncated series approximating a sawtooth function limited to an integer number $\underline{n}$ of the first harmonic frequencies, and described by the equation:

$$V_{AC}(t) = V_0 \sum_{k=1}^{n} \frac{2(-1)^k}{k^2 m(1-m)\pi^2} \sin(k(1-m)\pi) \sin(k\omega t),$$

$V_0$ being an adjusted voltage factor in order to obtain a desired peak voltage $V_{pp}$, the number of the first harmonic frequencies n of the development of the series is greater than or equal to 2, ω being the corresponding angular frequency at the fundamental frequency, and $\underline{m}$ being a real parameter comprised between 0 and 1, the values $\underline{m}$ belonging to the interval [0.5−δ4 0.5+δ4] being excluded, δ4 being greater than or equal to 0.1, preferably greater than or equal to 0.2;

the approached waveform before being standardized is equal to a development of a truncated series approximating a sawtooth function limited to an integer number $\underline{n}$ of the first harmonic frequencies, and described according to the equation:

$$V_{AC}(t) = V_0 \sum_{k=1}^{n} \frac{1}{k} \cos(k\omega t + \Phi),$$

$V_0$ being an adjusted voltage factor for obtaining a desired peak voltage $V_{pp}$, the number of the first harmonic frequencies $\underline{n}$ of the development of the series being greater than or equal to 2, ω being the corresponding angular frequency at the fundamental frequency, and Φ being a common phase shift to the harmonics comprised in the union of the intervals $$\left[\frac{\pi}{2} - \delta 3, \frac{\pi}{2} + \delta 3\right] \text{ and } \left[\frac{3\pi}{2} - \delta 3, \frac{3\pi}{2} + \delta 3\right]$$

with δ3 less than or equal to π/4, preferably less than or equal to π/6, and still more preferably less than or equal to π/8;

the approached waveform before being standardized is equal to a development of a truncated series approximating a sawtooth function limited to an integer number $\underline{n}$ of the first harmonic frequencies, and described by the equation:

$$V_{AC}(t) = V_0 \sum_{k=1}^{n} \frac{n-k+1}{n} \cos(k\omega t + \Phi),$$

$V_0$ being an adjusted voltage factor for obtaining a desired peak voltage $V_{pp}$, the number of the first harmonic frequencies $\underline{n}$ of the development of the series being greater than or equal to 2, $\omega$ being the angular frequency corresponding to the fundamental frequency, and $\Phi$ being a common phase shift to the harmonics comprised in the union of the intervals $$\left[\frac{\pi}{2} - \delta 2, \frac{\pi}{2} + \delta 2\right] \text{ and } \left[\frac{3\pi}{2} - \delta 2, \frac{3\pi}{2} + \delta 2\right]$$

with $\delta 2$ less than or equal to $\pi/4$, preferably less than or equal to $\pi/6$, and still more preferably less than or equal to $\pi/8$;
  the approached waveform before standardization equal to a development of a truncated series approximating the sawtooth function limited to an integer number n of the first harmonic frequencies, the number of harmonics being greater than or equal to 3, preferably equal to 4;
  the first and second slopes p1, p2 and/or the parameter $\underline{m}$ are adjusted by a feedback loop used for obtaining the desired voltage waveform at the first electrode supplied with energy.

The object of the invention is also a plasma treatment method of a substrate in a capacitively coupled plasma reactor, the plasma reactor containing a gas under pressure P, and including a first electrode, supplied with radiofrequency energy, and a second electrode, comprising a step for setting into place a substrate to be treated in proximity to an electrode from among the first electrode and the second electrode, and a step for generating an ion flow asymmetry as defined above.

According to particular embodiments, the plasma treatment method of a substrate includes one or several of the following features, taken alone or as a combination:
  the gas used gives the possibility of generating several chemical species which are either very reactive, or not very reactive, and the waveform of the energization voltage is adjusted so as to either to bring the generation of reactive species close to an electrode when they are beneficial to the treatment of the substrate, or to move away the species which are not very reactive and which act detrimentally to the treatment of the substrate;
  the plasma treatment method is comprised in the set formed by the plasma methods for deposition on a substrate, the plasma methods for etching a substrate, and the plasma methods for modifying the surface of a substrate.

An object of the invention is also a plasma treatment system for generating asymmetry of the ion flow comprising;
  a capacitively coupled radiofrequency plasma reactor, containing one gas or mixed gases under a total pressure P, including a first electrode, supplied with radiofrequency energy, and a second electrode, and
  a means for adjusting the total pressure P of the gas or of the mixed gases; and
  a voltage waveform generator, connected to the first electrode through a coupling capacitance, in order to generate a periodic radiofrequency voltage waveform V(t) having a lower frequency corresponding to a fundamental harmonic of the waveform of fundamental period T.

The plasma treatment system is characterized in that:
  the standardized voltage waveform, standardized in time and in amplitude over the interval [−1; 1], f(u) is an approached waveform with a degree of approximation to a standardized sawtooth radiofrequency function $f_{SAW}(u)$, u being the standardized time defined as the ratio of the time t over the fundamental period T, and
  the standardized sawtooth radiofrequency function $f_{SAW}(u)$ has a periodic pattern of a fundamental period T consisting in a first linear portion of time development of the standardized voltage with a first slope p1 immediately followed of a second linear portion of time development of the standardized voltage with a second slope p2 the first and second slopes being of different amplitudes and of opposite signs, the minimum and the maximum of the pattern having the same unit amplitude; and
  the degree of approximation of the approached waveform and the total pressure P of the gas or of the mixed gases are sufficient for causing appearance of an asymmetry of the ion flows between the ion flow at the first electrode and the ion flow at the second electrode.

According to particular embodiments, the system includes one or several of the following features, taken alone or as a combination:
  the means for adjusting the total pressure P of the gas or of the mixed gases and the voltage waveform generator are configured for applying one of the steps defined above;
  the second electrode is grounded or set to a floating potential.

The invention will be better understood upon reading the description of several embodiments which will follow, exclusively given as examples and made with reference to the drawings wherein.

Figure 2:
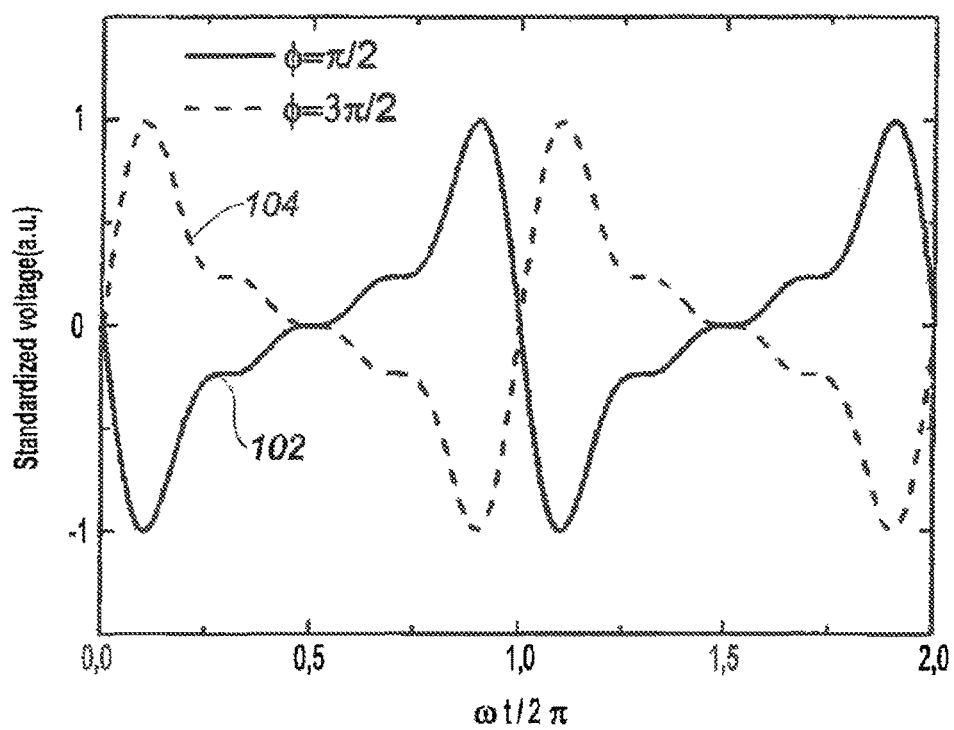
FIG. 2 is a view of a first waveform and of a second voltage waveform standardized according to a first embodiment, the energization voltage $V_{AC}(t)$ before standardization satisfying the equation $$V_{AC}(t) = V_0 \sum_{k=1}^{4} \frac{5-k}{4} \cos(k\omega t + \Phi)$$
Figure 3:
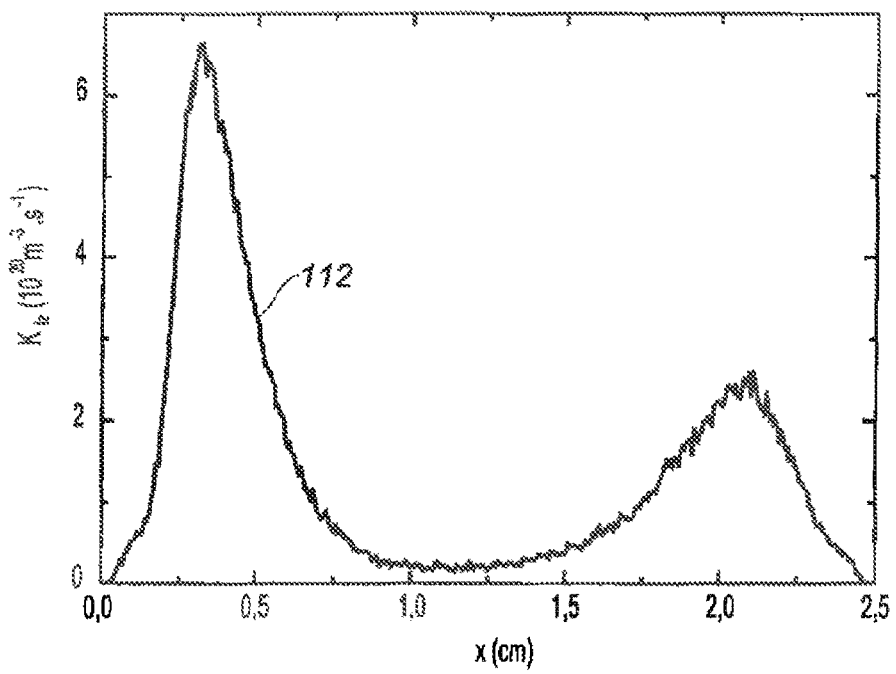
Figure 4:
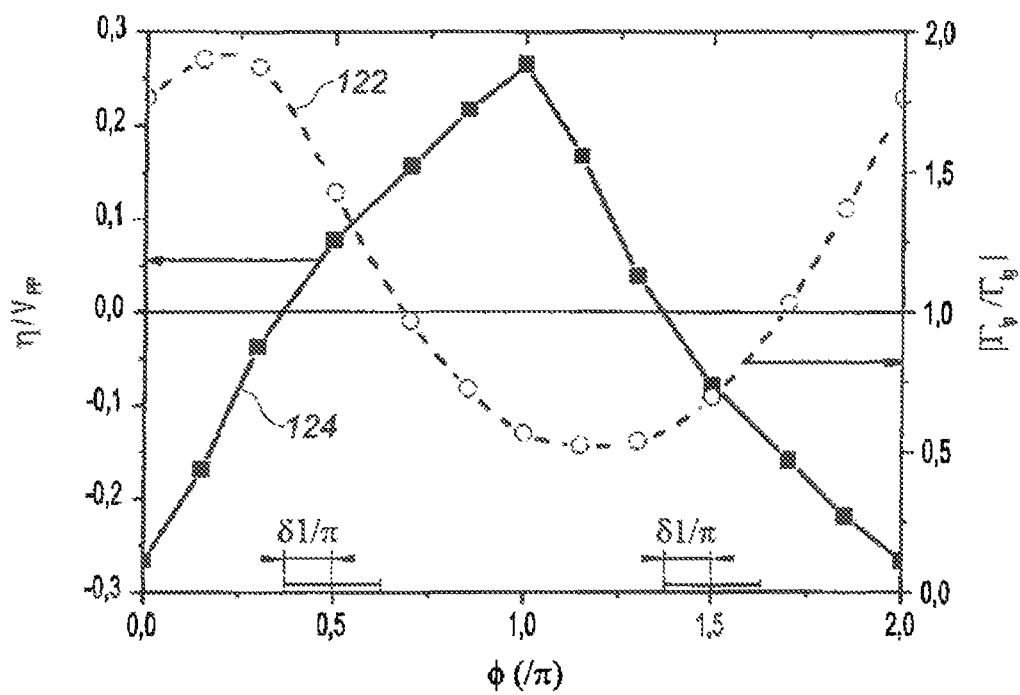
Figure 5:
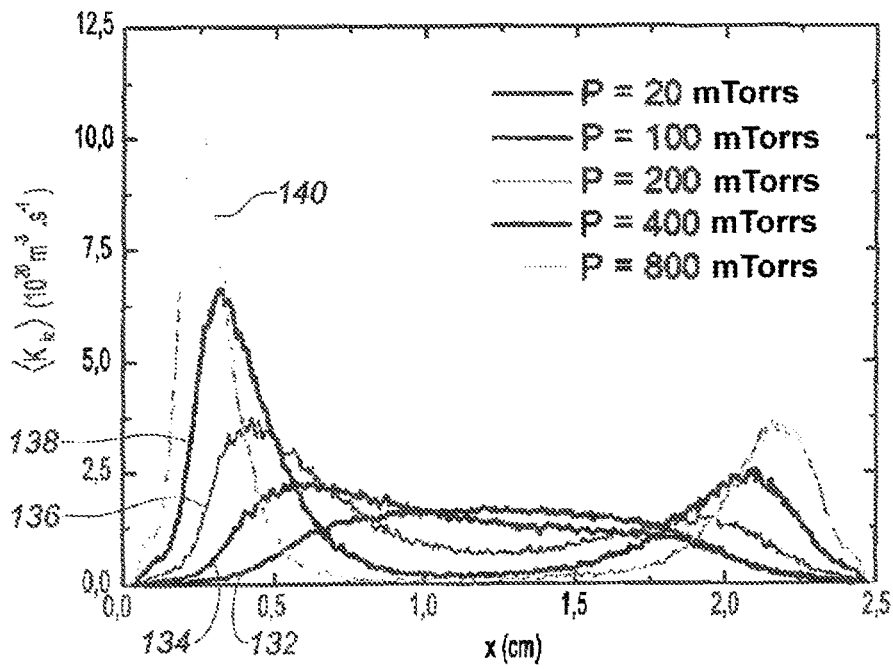
Figure 6:
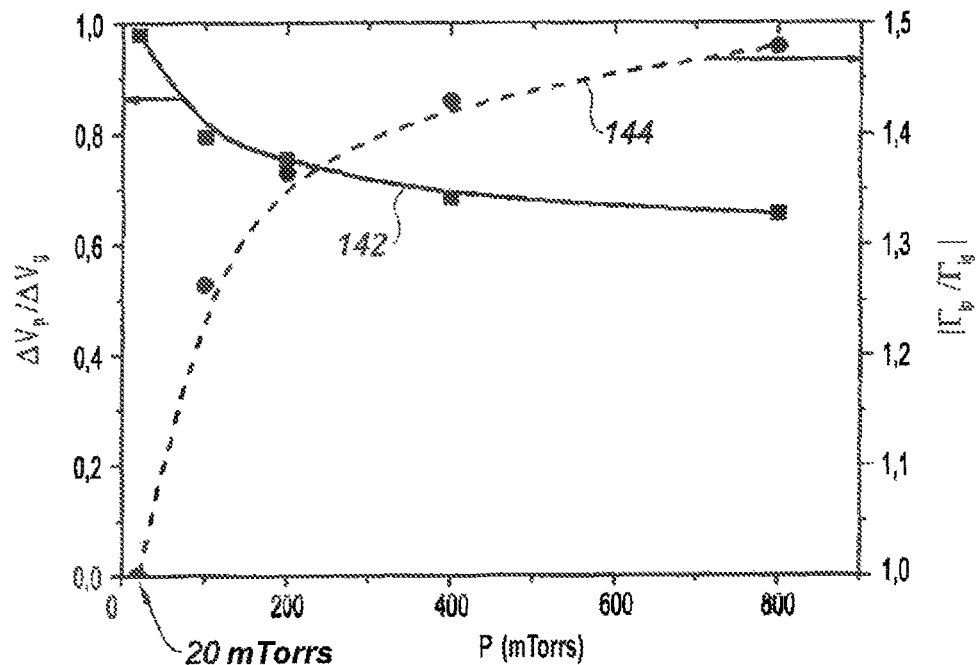
Figure 7A:
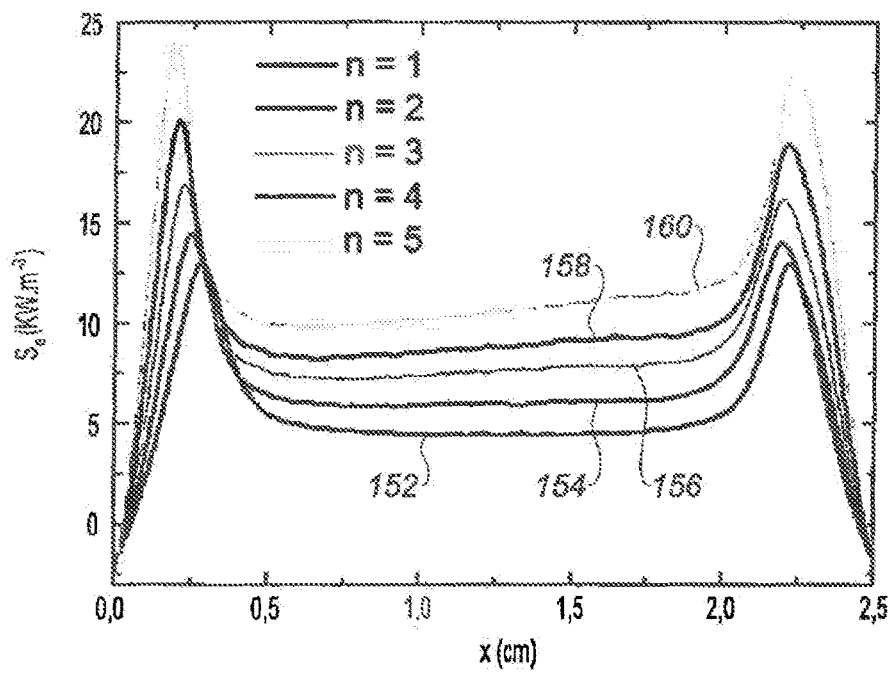
Figure 7B:
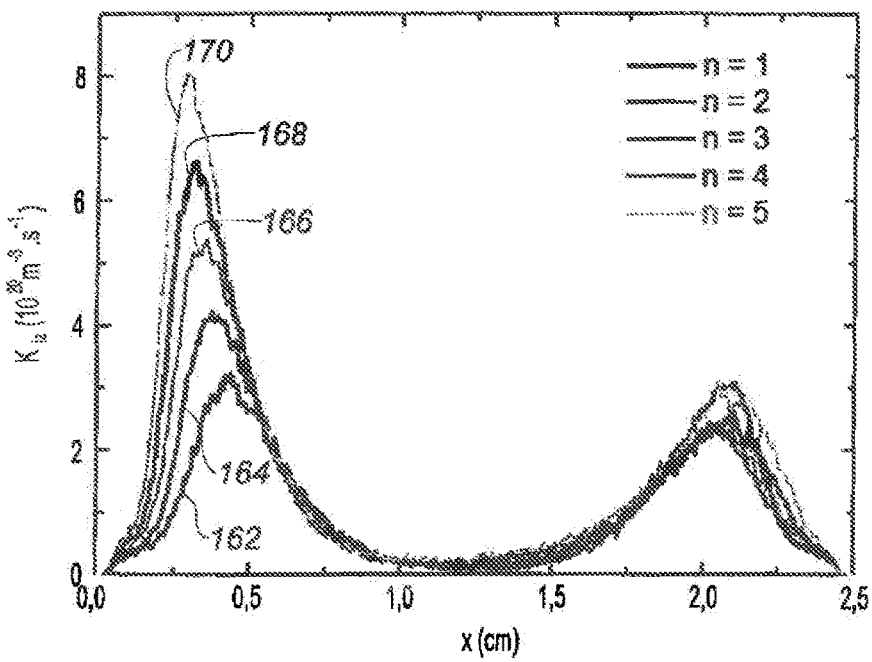
Figure 8:
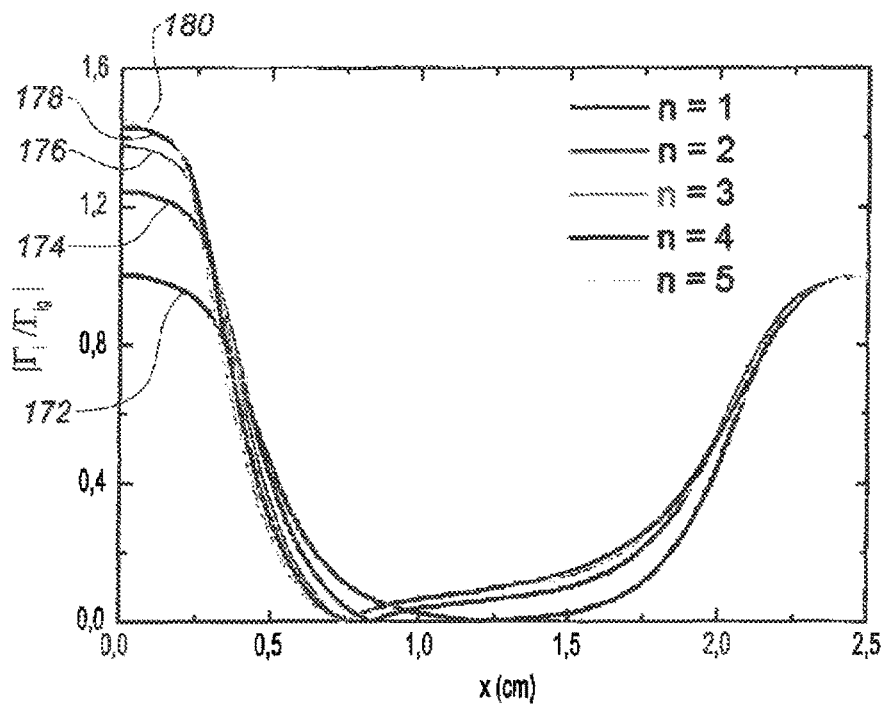
Figure 9:
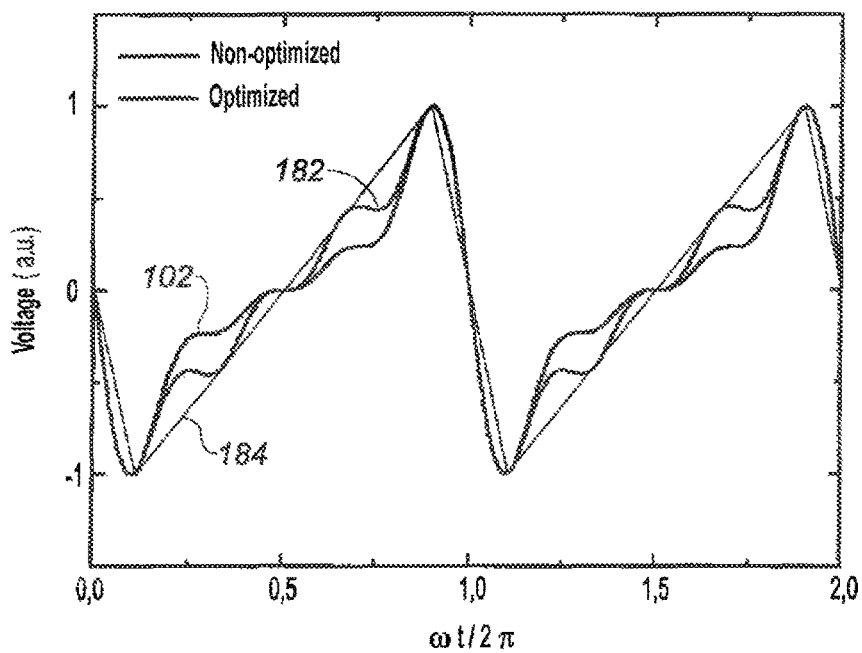

for a value of $\Phi$ respectively equal to $\pi/2$ and $3\pi/2$;

FIG. 3 is a view of a spatial profile of the average ionization rate over time $\langle K_{iz} \rangle$ of the plasma versus the preparation distance $\underline{x}$ separating an observed point of the plasma and the electrode supplied with energy, for a plasma configuration wherein the gas is argon under a pressure of 400 mTorrs and the waveform is that of FIG. 2 for $\Phi = \pi/2$ and a peak-to-peak voltage Vpp equal to 200V;

FIG. 4 is a view of the respective developments, according to a standardized shift angle $\Phi(/\pi)$ describing the interval [0,2], of the standardized self-biasing voltage $\eta/V_{pp}$ and of the ratio of the ion flows at the electrodes, in a plasma configuration for which the used gas is argon under a pressure P equal to 400 mTorrs, and the applied waveform, consisting of 4 harmonics, satisfies the equation, $$V_{AC}(t) = V_0 \sum_{k=1}^{4} \frac{5-k}{4} \cos(k\omega t + \Phi)$$

with a peak-to-peak voltage Vpp equal to 200V;

FIG. 5 is a view of a set of curves, parameterized by the pressure of the gas, of the development of the average ionization rate over time of the plasma versus the separation distance $\underline{x}$ separating an observed point of the plasma and the first electrode supplied with energy, for a plasma configuration wherein the gas is argon and the waveform is that of FIG. 2 for $\Phi = \pi/2$ and a peak-to-peak voltage Vpp equal to 200V;

FIG. 6 is a view of the respective developments, according to the pressure of the gas describing the interval [1 mTorr, 800 mTorrs], of the ratio of the difference of the voltages on either side of the sheath facing the electrode supplied with energy and of the difference of the voltages on either side of the sheath facing the grounded electrode, $\Delta V_p/\Delta V_g$, and of the absolute value of the ratio of the ion flows at the same electrodes, $|\Gamma_{ip}/\Gamma_{ig}|$, for a plasma configuration in which the gas is argon and the waveform is that of FIG. 2 for $\Phi = \pi/2$ and a peak-to-peak voltage Vpp equal to 200V;

FIGS. 7a, 7b are respectively the views of spatial profiles, depending on the distance x and parameterized according to the number n of harmonics making up the energization waveform of the plasma, on the average electronic heating rate over time, $\langle S_e \rangle$, and on the average ionization rate over time $\langle K_{iz} \rangle$ of the plasma, for a configuration of the plasma in which the gas used is argon under a pressure P equal to 400 mTorrs, and the applied waveform consisting of n harmonics, satisfies the equation, $$V_{AC}(t) = V_0 \sum_{k=1}^{n} \frac{n-k+1}{n} \cos(k\omega t + \Phi)$$

with $\Phi = \pi/2$ and a peak-to-peak voltage Vpp equal to 200V;

FIG. 8 is a view of spatial profiles according to the distance x, parameterized as a function of the number $\underline{n}$ of harmonics, of the standardized ion flow, for a same plasma configuration as the one used in FIGS. 7a and 7b;

FIG. 9 is a comparative view over two time periods of the first waveform of

FIG. 2 and of an optimized waveform of four harmonics, the energization voltage $V_{AC}(t)$ before standardization satisfies the equation $$V_{AC}(t) = V_0 \sum_{k=1}^{4} \frac{1}{k} \cos\left(k\omega t + \frac{\pi}{2}\right),$$

Figure 10:
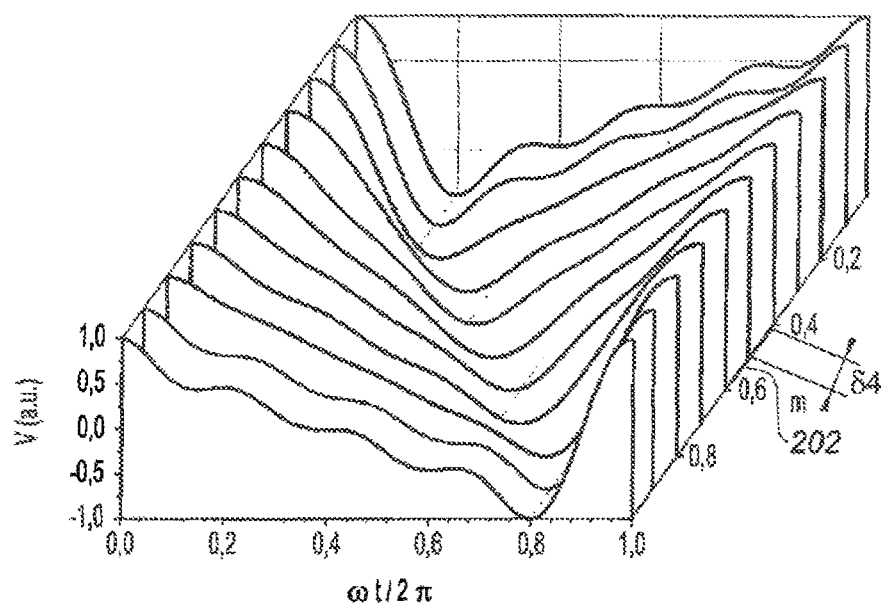
Figure 11:
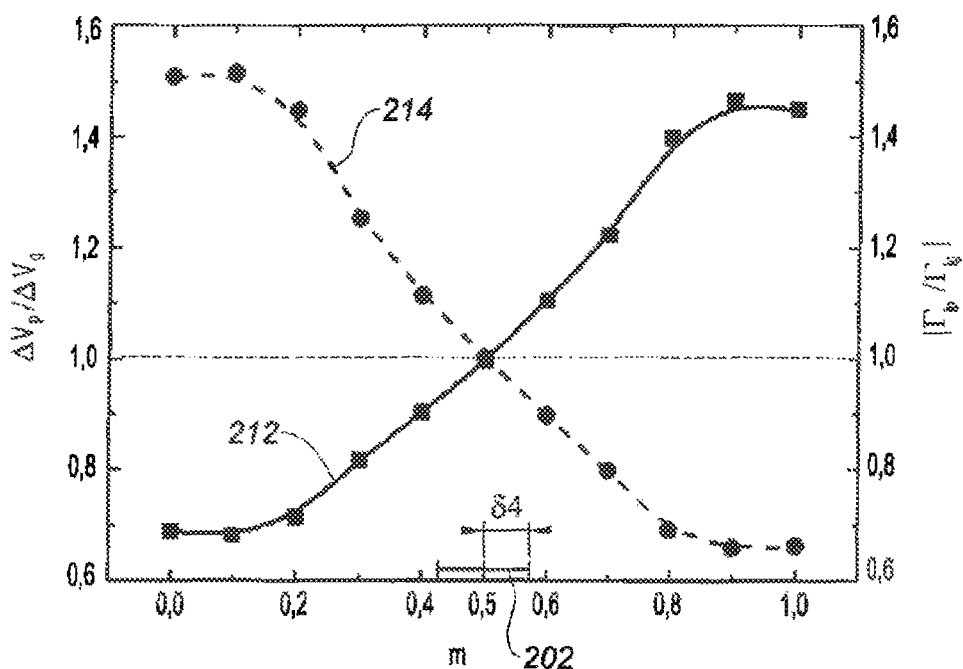
Figure 13:
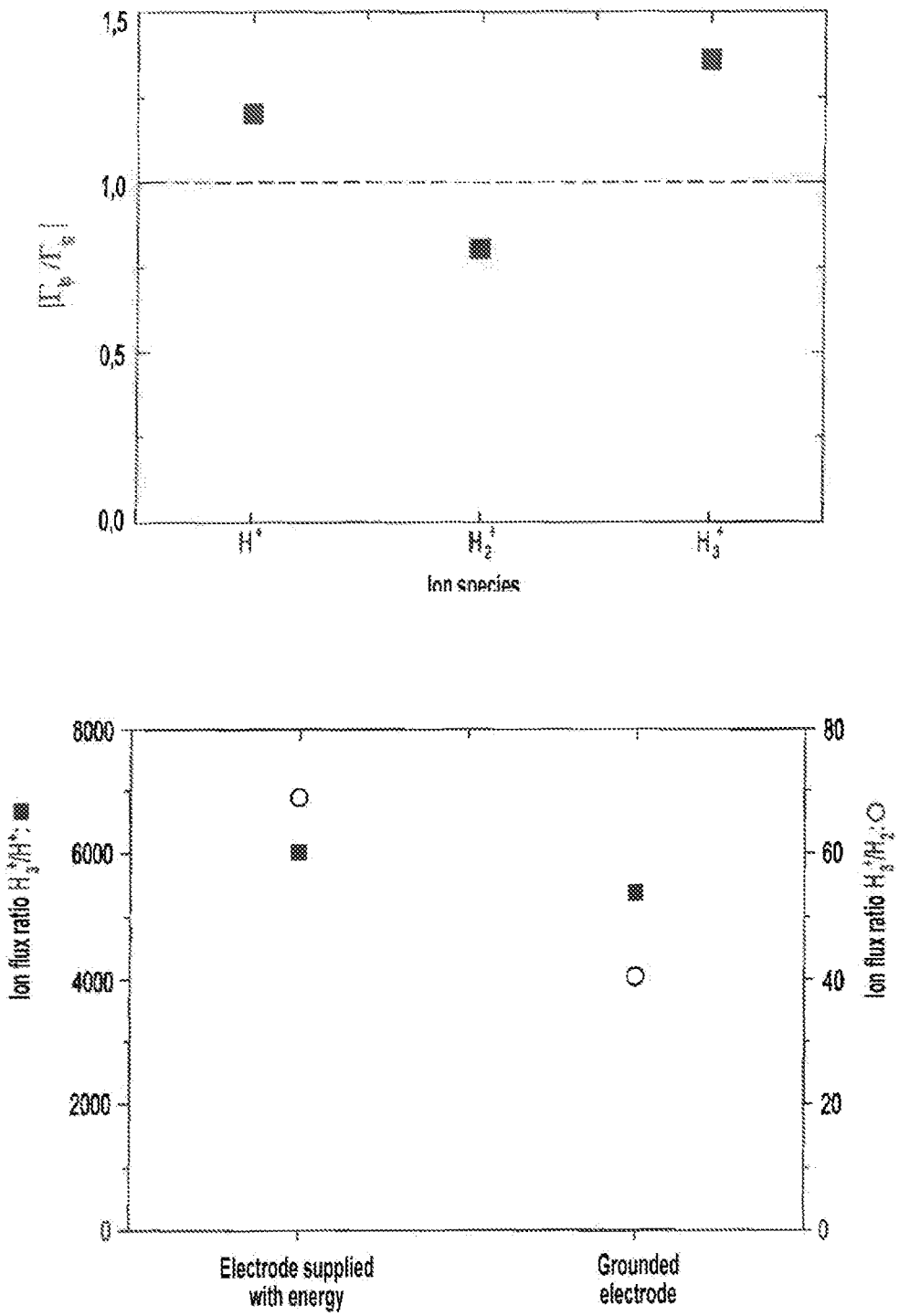

FIG. 10 is a view of a set of waveforms, parameterized by a parameter m varying between 0 and 1 and for which the energization voltage $V_{AC}(t)$ before standardization satisfies the equation:

$$V_{AC}(t) = V_0 \sum_{k=1}^{4} \frac{2(-1)^k}{k^2 m(1-m)\pi^2} \sin(k(1-m)\pi)\sin(k\omega t),$$

which without the waveforms associated with $\underline{m}$ belonging to the interval $[0.5-\delta_4, 0.5+\delta_4]$ is a third embodiment of the waveforms of the invention;

FIG. 11 is a view of the development according to the parameter $\underline{m}$, of the ratio of the difference of the voltages on either side of the sheath facing the first electrode supplied with energy and of the difference of voltages on either side of the sheath facing the second grounded electrode, $\Delta V_p/\Delta V_g$, and of the ratio of the ion flows at the same electrodes, $|\Gamma_{ip}/\Gamma_{ig}|$, for a plasma configuration in which the gas is argon and the waveform is that of FIG. 10 for a peak-to-peak voltage Vpp equal to 200V;

FIG. 12 is a view of the absolute value, calculated from a simulation based on a fluid dynamics model, of the respective ratios of the ion flows at the electrode supplied with energy and at the grounded electrode $|\Gamma_{ip}/\Gamma_{ig}|$, for the ions $H^+$, $H_2^+$ and $H_3^+$ for a plasma configuration in which the gas is dihydrogen under a pressure P of 850 mTorrs and the waveform is the non-optimized waveform of four frequencies of FIG. 9 with a peak-to-peak voltage Vpp equal to 200V;

FIG. 13 is a view of the ratios of ion flows, calculated by means of a simulation based on a fluid dynamics model, between $H_3^+$ and $H^+$, and between $H_3^+$ and $H_2^+$, at the electrode supplied with energy and at the grounded electrode, for a plasma configuration in which the gas is dihydrogen under a pressure P of 850 mTorrs and the waveform is a non-optimized waveform of four frequencies of FIG. 9 with a peak-to-peak voltage Vpp equal to 200V;

FIG. 14 is a geometrical view giving the possibility of viewing a functional distance separating the first non-optimized standardized waveform of FIG. 9 and the associated standardized sawtooth function.

Figure 1:
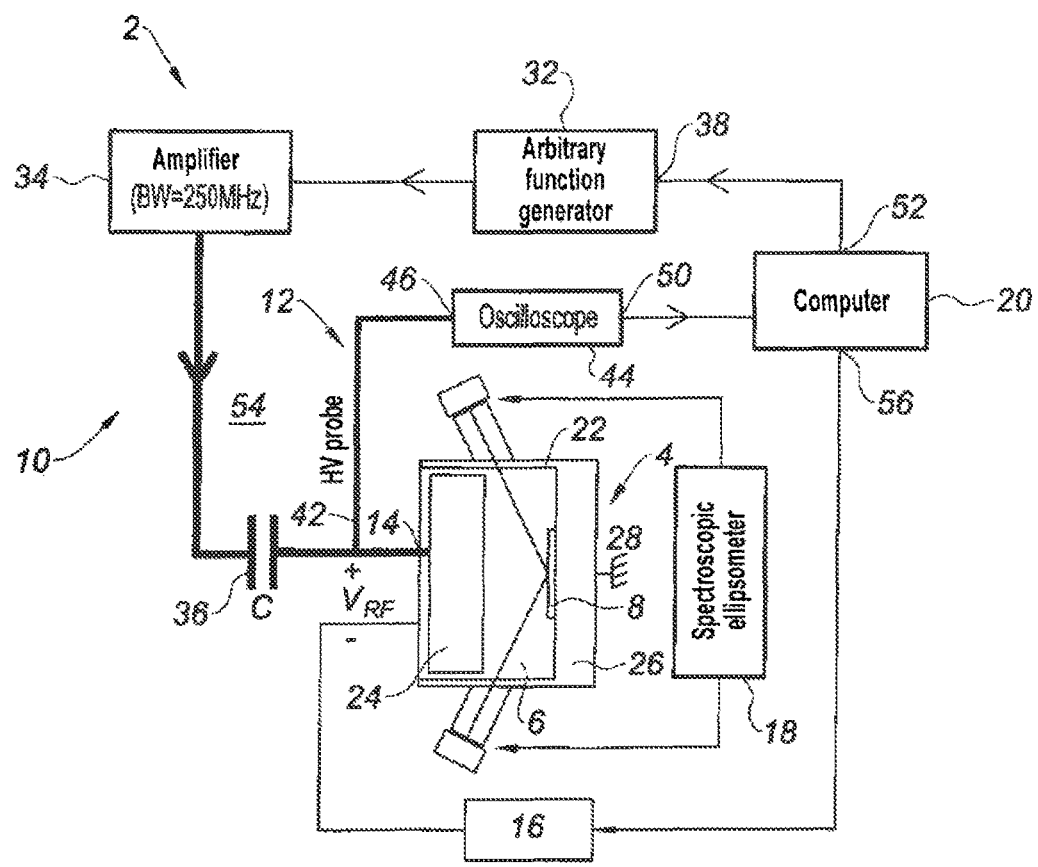
FIG. 1 is a schematic view of the architecture of a system applying a plasma treatment method according to the invention of a substrate by means of a capacitively coupled RF plasma reactor and energized by a waveform generator with a slope asymmetry effect.

According to the invention and according to FIG. 1, a plasma treatment system 2 for generating an ion flow asymmetry comprises a capacitively coupled RF plasma reactor 4 CCP containing gas 6 or a mixture of gases, a substrate 8 to be treated, programmable energization means 10 for the plasma reactor 4, means for measuring 12 the voltage waveform injected at the inlet 14 of the reactor 4, means 16 for adjusting the total pressure P of the gas or of the mixed gases contained in the plasma, means 18 for following the treatment process, and of the surface condition of the substrate 8, and an electronic computer 20.

The plasma reactor 4 comprises a treatment chamber 22, a first electrode 24 supplied with RF energy with a first RF voltage wave, and a second electrode 26 here grounded 28 and without any power supply.

Alternatively, the second electrode is set to a floating potential, or biased with a second RF voltage wave. In the case when the second electrode is biased, the first RF voltage wave on the first electrode assumes as a reference an external mass which will preferably be identical with that of the second electrode.

The substrate 8, intended to be subject to the plasma treatment, is placed here as an illustration on the second grounded electrode 26 or without any electric power supply. Alternatively, the substrate 8 to be treated is positioned in proximity to the first electrode 24, supplied with RF energy.

In practice, the selection of the positioning of the substrate 8 will depend on the chemical reaction which one will seek to promote or to avoid.

The programmable energization means 10 comprise, connected in series, a programmable voltage waveform generator 32, an RF power amplifier 34 and a coupling capacitance 36, the coupling capacitance 36 being connected between the first electrode 24 of the reactor 4 and the output of the RF power amplifier 34. The waveform generator 32 includes an input terminal 38, connected to the computer 20 for receiving from the latter characteristic parameters of the waveform to be generated.

The means 12 for measuring the voltage waveform injected at the inlet 14 of the reactor 4 comprises a High Voltage (HV) probe 42 connected on the inlet 14 of the reactor 4 for measuring the energization voltage injected at the first electrode 24 and an oscilloscope 44 for receiving, at each instant, in an input terminal 46 and stemming from the probe, the energization voltage measured at the first electrode 24. The oscilloscope 44 includes an output terminal 50, connected to the computer 20 for delivering to the latter the time development signal of the energization waveform measured at the inlet 14.

The electronic computer 20 includes a first output terminal 52, connected to the waveform generator 32 through the input terminal 38, in order to provide the waveform generator 32 with commands as characteristic parameters of the waveform to be generated. The computer 20 is configured for receiving the time development signal of the measured energization waveform provided by the oscilloscope 44, for analyzing the measured waveform, for example by breaking it down on a base of suitable signals, for then comparing the measured and analyzed waveform with the desired waveform according to the invention at the first electrode 24, and for correcting, depending on the comparison result, the measured waveform by modifying the characteristic parameters of the waveform generated by the programmable waveform generator 32.

Thus, the desired waveforms on the first electrode 24 are produced by using a feedback loop 54, produced by the chain of components connected in series which are the waveform generator 32, the RF power amplifier 34, the coupling capacitance 36, the HV probe 42, the oscilloscope 44 and the computer 20.

The computer 20 also includes here a second output terminal 56, connected at the input to the means 16 for adjusting the pressure P of the gas in order to provide a desired pressure set value of the gas 6 contained in the reactor 4.

Alternatively, the desired total pressure set value of the gas 6 or of the mixed gases contained in the reactor 4 is provided manually.

The programmable voltage waveform generator 32 is configured for generating a radio-frequency (RF) voltage waveform V(t) having a lower frequency corresponding to a fundamental harmonic of the waveform, a positive maximum amplitude noted as $V_{max}$ and a negative minimum amplitude noted as $V_{min}$. The absolute values of these amplitudes, $V_{max}$ and $-V_{min}$, are supposed here to be equal but alternatively they may be different.

A voltage waveform, standardized in amplitude and in time, noted as f(u), may be defined from the waveform V(t) by a transformation in which u=t/T, and $f_{max}=-f_{min}=1$ with $f_{max}$ and $f_{min}$ corresponding to $V_{max}$ and $V_{min}$ respectively.

The voltage waveform, standardized in amplitude and in time, noted as f(u) is defined here by the equation:

$$f(u) = \frac{V(uT) - ((V_{max} + V_{min})/2)}{(V_{max} - V_{min})/2}$$

The voltage waveform, standardized in amplitude and in time, f(u) is an approximate waveform with a degree of approximation of a standardized sawtooth radiofrequency function in amplitude and in time $f_{SAW}(u)$.

The standardized sawtooth radiofrequency function has a periodic pattern with a consistent fundamental period T in a first linear portion of the time development of the standardized voltage with a first slope p1, immediately followed by a second linear portion of time development of the standardized voltage with a second slope p2, the first and second slopes p1, p2 being of different amplitudes and of opposite signs, the minimum and the maximum of the pattern having the same unit amplitude.

The degree of approximation of the approximate waveform and the pressure P of the gas are selected to be sufficiently large so as to cause appearance of an asymmetry of the ion flows between the ion flow at the first electrode 24 and the ion flow at the second electrode 26.

The periodic radio-frequency voltage waveform V(t) is differentiable and has a slope asymmetry measured by a slope asymmetry factor F parameterized by an integer p greater than or equal to 1 and defined by the equation:

$$F(p) = \left| \frac{\int_{t \in [0,T], V' > 0} |(V'(t))^p| - \int_{t \in [0,T], V' < 0} |(V'(t))^p|}{\int_{t \in [0,T]} |(V'(t))^p|} \right|$$

V'(t) referring to the derivative of the waveform at instant t.

The numerator of F(p) represents the difference between a first average $m_+(p)$ on a periodic pattern of positive slopes of the waveform V(t) and a second average $m_-(p)$ on the same periodic pattern of the negative slopes of the waveform V(t).

The denominator of F(p) represents a measurement of the norm of the derivative of the periodic waveform.

The waveform has a sufficient slope asymmetry so as to observe an ion flow asymmetry effect on the first and second electrode when F(p) is greater than or equal to a threshold, which threshold depends on the integer p.

Preferably, p is set to 2. In this case, the waveform has a sufficient slope asymmetry for observing an ion flow asymmetry effect on the first and second electrode when F(2) is greater than or equal to a threshold equal to 0.1.

From among the required but insufficient conditions in order that the waveform has a present asymmetry, the two required following conditions should be mentioned.

According to a first condition, the approximate voltage waveform after standardization f(u) should be a non-invariant waveform by time reversal, i.e. a waveform for which there does not exist any real constant τ satisfying:

f(u)=f(τ−u), u designating the standardized time development variable of the standardized approximate voltage waveform.

According to a second condition, for each current maximum of the standardized approximate voltage waveform identified by a travel index j, the duration separating the instant of occurrence t(max(j)) of the current maximum of the instant of occurrence t(min(j)) of the first minimum min(j) following the current maximum max(j), is different from the duration separating the instant of occurrence t(max(j+1)) of the first maximum max(j+1) immediately following the first minimum min(j) and the instant of occurrence t(min(j)) of the first minimum min(j).

Both of these conditions are met when a slope asymmetry factor F(p) is different from zero, for any value of the integer p.

Also, both of these conditions are met when the standardized waveform is sufficiently close to a sawtooth function for which the slopes of opposite signs p1 and p2 have different absolute values.

According to FIG. 2 and a first embodiment of the invention, a first curve 102 represents the time development of the standardized energization voltage $V_{AC}(t)$ of a first waveform, the energization voltage $V_{AC}(t)$ before standardization satisfying the equation $$V_{AC}(t) = V_0 \sum_{k=1}^{4} \frac{5-k}{4} \cos(k\omega t + \Phi)$$

for a particular value of $\Phi$ equal to $\pi/2$.

$V_0$ refers to a voltage factor, w is the angular frequency, here corresponding to a frequency fr of 13.56 MHz ($\omega=2\pi$fr). $V_0$ is set here so as to provide the desired peak-to-peak voltage $V_{pp}$ equal to 200V A second curve 104 represents the time development of the standardized energization voltage $V_{AC}(t)$ of a second waveform, the energization voltage $V_{AC}(t)$ before standardization satisfying the equation $$V_{AC}(t) = V_0 \sum_{k=1}^{4} \frac{5-k}{4} \cos(k\omega t + \Phi)$$

for a value of $\Phi$ equal to $3\pi/2$.

For both of these waveforms, the amplitude asymmetry estimated by means of a factor $\alpha$, equal to at least the ratio of the maximum over the minimum of the voltage $V_{AC}(t)$ of the waveform is equal to 1. Thus, in this case, the asymmetry does not stem from the amplitude effect.

The first waveform 102 has over the duration of a period, a first increasing signal portion while being globally close to a first ramp with a positive slope p1 equal to about 2.5, and a second decreasing signal portion while being globally close to a second ramp with a second negative slope p2 equal to about −10.

Similarly, the second waveform 104 has over the duration of a period, a first decreasing signal portion while being globally close to a first ramp with a negative slope equal to about −2.5, and a second increasing signal portion while being globally close to a second ramp with a second positive slope equal to about 10.

Thus, the first and second voltage waveforms of the first embodiment of the invention may themselves be considered as an approximate waveform with a certain degree of approximation respectively of a first radiofrequency sawtooth function and of a second radiofrequency sawtooth function, respectively the slopes of the ramps (p1; p2) of the first and second radiofrequency sawtooth functions standardized in amplitude being respectively equal to (2.5; −10) and (−2.5; 10).

According to FIG. 3, a third curve 112 describes a spatial profile computed by means of a simulation of the PIC (Particle-In-Cell) simulation of the average ionization rate over time $\langle K_{iz} \rangle$ of the plasma depending on the separation distance $\underline{x}$ separating an observed point of the plasma and the first electrode supplied with energy.

The profile is calculated here for a plasma configuration wherein the gas is argon under a pressure of 400 mTorrs and the waveform is that of FIG. 2 for $\Phi=\pi/2$ and a peak-to-peak voltage Vpp equal to 200V.

The energization signal generated in the plasma an asymmetrical spatial distribution of the energetic electron density, i.e. a higher density of energetic electrons on an electrode, here the first electrode 24 supplied with RF energy, than on the other one, here the second electrode 26 which is grounded. By means of this, the rate for generating chemical species which depends on the injected gases, here argon, will also have an asymmetrical spatial distribution, illustrated in FIG. 3, wherein the average ionization rate over time $\langle K_{iz} \rangle$ of the plasma is twice greater at the first electrode 24 than the one observed at the second electrode 26.

This gives the possibility of increasing the flow arriving on an electrode, here the first electrode 24, in order to be able for example to deposit or etch more rapidly a material. This flow increase on the first electrode 24 is accomplished without increasing the energy of the ions.

Advantageously, the flow of ions may be smaller on the other electrode, here the second electrode 26.

Such an effect gives the possibility of increasing the yield of the plasma treatment process of the substrate, either by depositing or etching, or by modifying the surface of interest of the substrate more rapidly on the first electrode, and by thereby reducing the time required for the deposition, or for the etching, or for the modification of the surface of interest, or by reducing the deposition, or the etching, or the modification of the surface of interest on the second electrode, and by thereby reducing the maintenance time of the second electrode for cleaning or replacement.

It should be noted that in order to observe this slope asymmetry effect, it is necessary that the pressure of the gas be sufficient, i.e. here in the case of argon, greater than or equal to 100 mTorrs.

Here, the number of harmonics making up the first waveform is equal to 4, which is a good compromise between the capability of approximating a sawtooth signal and the simplicity for producing the energization waveform.

According to FIG. 4, a first curve 122 describes the development of the standardized self-biasing voltage $\eta/V_{pp}$ according to a standardized shift angle $\Phi(/\pi)$ describing the interval [0.2], calculated by simulation in a plasma configuration for which the gas used is argon under a pressure P equal to 400 mTorrs, and the applied waveform consisting of 4 harmonics, satisfies the equation, $$V_{AC}(t) = V_0 \sum_{k=1}^{4} \frac{5-k}{4} \cos(k\omega t + \Phi)$$

with a peak-to-peak voltage Vpp equal to 200V.

A second curve 124 describes the development of the ratio of the ion flows at the electrodes according to the standardized shift angle $\Phi(/\pi)$ for the same plasma configuration.

While the self-biasing voltage $\eta$ is positive for a phase shift $\Phi=\pi/2$, which corresponds to the first waveform of FIG. 2, it is negative for $\Phi=3\pi/2$, which corresponds to the second waveform of FIG. 2.

The ratio of the ion flows at the electrodes ($|\Gamma_{ip}/\Gamma_{ig}|$), defined as the absolute value of the flow ratio $\Gamma_{ip}$ of the ions arriving at the first electrode supplied with RF energy over the flow $\Gamma_{ig}$ of the ions arriving at the grounded second electrode 26, is greater than unity for $\Phi=\pi/2$, and less than unity for $\Phi=3\pi/2$, which shows the slope asymmetry effect in both of these remarkable cases.

For both of these waveforms, are thus obtain the greatest ion flow for the lowest ion bombardment energy IBE (Ion Bombardment Energy). Both of these optima correspond to the first electrode 24 supplied with energy in the case of $\Phi=\pi/2$, and at the grounded second electrode 26 in the case of $\Phi=3\pi/2$.

Both curves 122 and 124 give the possibility of widening, according to a second embodiment of the invention, the class of both functions described in FIG. 2, to a second set of functions approximating the two same asymmetrical sawtooth functions in slope than those associated with the first and second waveforms of FIG. 2. The functions of the second set of voltage waveforms according to the invention satisfy the equation;

$$V_{AC}(t) = V_0 \sum_{k=1}^{4} \frac{5-k}{4} \cos(k\omega t + \Phi)$$

with $\Phi \in [\pi/2-\delta 1, \pi/2+\delta 1] \cup [3\pi/2-\delta 1, 3\pi/2+\delta 1]$.

$\delta 1$ is selected to be equal to or less than $\pi/4$, preferably less than or equal to $\pi/6$, and even more preferably less than or equal to $\pi/8$.

According to FIG. 5, first, second, third, fourth, fifth curves, 132, 134, 136, 138, 140, parameterize with the pressure values of the gas equal to 20 mTorrs, 100 mTorrs, 200 mTorrs, 400 mTorrs, 800 mTorrs respectively represent the time development of the average ionization rate over time of the plasma $\langle K_{iz} \rangle$ depending on the separation distance $\underline{x}$ separating an observed point of the plasma and the first electrode 24 supplied with energy, for a plasma configuration in which the gas is argon and the waveform is that of FIG. 2 for $\Phi=\pi/2$ and a peak-to-peak voltage Vpp equal to 200V.

For the lowest pressure P equal to 20 mTorrs, the first curve 132 shows that ionization occurs in the core of the plasma and has a symmetrical profile around a middle axis separating the first electrode and the second electrode.

When P increases, the ionization increasing takes place in proximity to the electrodes and clear asymmetry appears between the side of the first electrode 24 and the side of the second electrode 26.

According to FIG. 6, a first curve 142 and a second curve 144 represent the respective developments, depending on the pressure of the gas describing the interval [1 mTorr, 800 mTorrs], on the ratio of the difference of the voltages on either side of sheath facing the electrode supplied with energy and of the difference of the voltages on either side of the sheath facing the grounded electrode, $\Delta V_p / \Delta V_g$, and on the ratio of the ion flows at the same electrodes, $|\Gamma_{ip}/\Gamma_{ig}|$, for a plasma configuration in which the gas is argon and the waveform is the one of FIG. 2 for $\Phi=\pi/2$, and a peak-to-peak voltage Vpp equal to 200V;

As shown by FIG. 6, at a very low pressure, here P=20 mTorrs for argon gas, no asymmetry can be demonstrated. It should be noted that the increase in the degree of asymmetry, in terms of maximum bombardment energy IBE as of ion flow, is not linear with the increase in the pressure P. The asymmetry is detectable from a 100 mTorrs, sharply increases at about 200 mTorrs, and then increases more slowly.

According to FIGS. 5 and 6, the pressure is estimated to be sufficient for causing appearance of an asymmetry of the ion flow when the pressure P of the gas is greater than or equal to 100 mTorrs, that the gas is argon and that the waveform is the one of FIG. 2 form $\Phi=\pi/2$. This threshold pressure value is substantially identical when the waveform is the waveform of the sawtooth corresponding to the first waveform of FIG. 2.

Generally, the pressure P of the gas is estimated to be sufficient for generating an ion flow asymmetry when the pressure P is greater than or equal to a threshold pressure value $P_s$(gas), depending on the nature of the gas and defined as the pressure above which an ion flow asymmetry clearly appears between the ion flow at the first electrode and the ion flow at the second electrode, and when the standardized energization waveform is a standardized sawtooth function for which the absolute value of the gentleness slope is equal to 2.5. A threshold pressure value $P_s$(gas), depending on the nature of the gas may be defined as the pressure above which an ion flow asymmetry clearly appears between the ion flow at the first electrode and the ion flow at the second electrode, and when the standardized energization waveform is expressed by the equation, $$V_{AC}(t) = V_0 \sum_{k=1}^{4} \frac{n-k+1}{n} \cos(k\omega t + \Phi)$$

with $\Phi=\pi/2$ or when the waveform is a waveform for which the slope asymmetry factor F(2) is equal to 0.1.

According to FIG. 7a, first, second, third, fourth, fifth spatial profiles, 152, 154, 156, 158, 160, respectively parameterized according to the alternative number $\underline{n}$ of 1 to 5 harmonics making up the energization waveform of the plasma, illustrate variations in the average electronic heating rate over time, $\langle S_e \rangle$, depending on the distance $\underline{x}$, for a configuration of the plasma in which the gas used is argon under a pressure P equal to 400 mTorrs, and the applied waveform, consisting of n harmonics, satisfies the equation, $$V_{AC}(t) = V_0 \sum_{k=1}^{n} \frac{n-k+1}{n} \cos(k\omega t + \Phi)$$

with $\Phi=\pi/2$ and a peak-to-peak voltage Vpp equal to 200V;

According to FIG. 7b, first, second, third, fourth, fifth spatial profiles, 162, 164, 166, 168, 170, respectively parameterized according to the alternative number $\underline{n}$ of 1 to 5 harmonics making up the energization waveform of the plasma, illustrate the variations in the average ionization rate over time $\langle K_{iz} \rangle$ of the plasma depending on the distance $\underline{x}$ for an identical plasma configuration with that of FIG. 7a.

According to FIG. 7a, when the number of harmonics $\underline{n}$ increases, the first maximum of $\langle S_e \rangle$ is brought closer to the first electrode supplied with RF energy while the second maximum hardly moves towards the second grounded electrode 26, which means that the thickness of the sheath only decreases for the one located facing the first electrode 24 supplied with energy.

In FIG. 7a, only small differences of amplitudes of the maxima of $\langle S_e \rangle$ in proximity to the electrodes may be observed.

Conversely in FIG. 7b, a sharp difference is perceivable between two maxima of the profile of the average ionization rate over time $\langle K_{iz} \rangle$. The value of the maximum of $\langle K_{iz} \rangle$ in proximity of the first electrode 24 supplied with energy is greater than at least twice the value of the maximum of $\langle K_{iz} \rangle$ in proximity to the second grounded electrode 26 for n greater than or equal to 4.

As a consequence of the asymmetry which appears in the profile of $\langle K_{iz} \rangle$ when n is greater than or equal to 2, the ion flow is different from one electrode to the other as shown in FIG. 8.

According to FIG. 8, the ion flows, illustrated by the curves 172, 174, 176, 178, 180 respectively associated with a number of harmonics n varying from 1 to 5, are standardized relatively to the ion flow observed on the second grounded electrode 26. The ion flow on the first electrode 24 may exceed by 40% that of the second grounded electrode 26. Indeed, while the ion flow slightly increases at the second grounded electrode 26 when the number of harmonics n increases from 1 to 5, at the same time, the ion flow on the first electrode supplied with energy becomes twice the flow.

The equation of the voltage waveforms which is written as:

$$V_{AC}(t) = V_0 \sum_{k=1}^{n} \frac{n-k+1}{n} \cos(k\omega t + \Phi)$$

with $\Phi=\pi/2$, gives the possibility of widening according to a third embodiment of the invention, the class of the functions described by this equation and limited to a value of $\Phi=\pi/2$, to a third set of functions always approximating the two same asymmetrical sawtooth functions in slope than those associated with the first and second waveforms of FIG. 2. The functions of the third set of voltage waveforms according to the invention satisfy the equation;

$$V_{AC}(t) = V_0 \sum_{k=1}^{n} \frac{n-k+1}{n} \cos(k\omega t + \Phi)$$

with $\Phi \in [\pi/2-\delta 2, \pi/2+\delta 2] \cup [3\pi/2-\delta 2, 3\pi/2+\delta 2]$.

$\delta 2$ is selected to be less than or equal to $\pi/4$, preferably less than or equal to $\pi/6$, and even more preferably less than or equal to $\pi/8$.

According to FIG. 9, an optimized waveform 182 of the first non-optimized waveform 102 of FIG. 2 is made closer to the sawtooth function 184 corresponding to the non-optimized waveform 102 by minimizing the two steepest rising edges of the first non-optimized waveform 102. The equation of the optimized waveform 182 is written as:

$$V_{AC}(t) = V_0 \sum_{k=1}^{4} \frac{1}{k} \cos\left(k\omega t + \frac{\pi}{2}\right),$$

wherein $V_0$ refers to a voltage factor, $\omega$ is the angular frequency, corresponding here to a frequency f of 13.56 MHz ($\omega=2\pi f$). $V_0$ is set here so as to obtain the desired peak-to-peak voltage $V_{pp}$ equal to 200V.

Like this was done for the third embodiment, the equation of the optimized waveform 182 gives the possibility of widening according to a fourth embodiment of the invention, the class of the functions described by the equation $$V_{AC}(t) = V_0 \sum_{k=1}^{4} \frac{1}{k} \cos\left(k\omega t + \frac{\pi}{2}\right)$$

limited to a value of $\Phi=\pi/2$ and to a number n of harmonics equal to 4, to a fourth set of functions always approximating the two same sawtooth functions asymmetrical in slope as those associated with the first and second waveforms of FIG. 2. The functions of the fourth set of voltage waveforms according to the invention satisfy the equation:

$$V_{AC}(t) = V_0 \sum_{k=1}^{n} \frac{1}{k} \cos(k\omega t + \Phi),$$

wherein n refers to a number of harmonics greater than or equal to 2, and $\Phi$ refers to a uniform phase-shift angle between the harmonics such that $\Phi \in [\pi/2-\delta 3, \pi/2+\delta 3] \cup [3\pi/2-\delta 3, 3\pi/2+\delta 3]$.

$\delta 3$ is selected to be less than or equal to $\pi/4$, preferably less than or equal to $\pi/6$, and even more preferably less than or equal to $\pi/8$.

According to a fifth embodiment of waveforms according to the invention, it is possible to continuously vary the asymmetry of the discharge by using a set of waveforms defined by the equation:

$$V_{AC}(t) = V_0 \sum_{k=1}^{n} \frac{2(-1)^k}{k^2 m(1-m)\pi^2} \sin(k(1-m)\pi)\sin(k\omega t),$$

wherein n is the number of harmonics, and m is a parameter such that the minimum of the waveform would be at a fraction m of a period when the waveform consists of an infinite number of frequencies. When m approaches 0, the waveform approaches in an optimized way the rising sawtooth waveform ($\Phi=\pi/2$) truncated at the harmonic rank n. When m approaches 1, the waveform approaches in an optimized way described in FIG. 9 the falling sawtooth waveform ($\Phi=3\pi/2$), i.e. having a more gentle falling slope than the rising slope, truncated at rank n. The values of m close to or equal to 0.5, corresponding to waveforms close or equal to those of a triangle, truncated at the harmonic rank and n and symmetrical, have to be removed. Thus m has to satisfy the condition:

$m \in [0; 0.5-\delta 4] \cup [0.5+\delta 4; 1]$ $\delta 4$ is selected to be greater than or equal to 0.1, preferably greater than or equal to 0.2.

According to FIG. 10, eleven waveforms, parameterized by 11 different values of the parameter m varying between 0 and 1 are described in the case when the number n of harmonics is set to 4. In this case, the energization voltage $V_{AC}(t)$ of the waveforms before standardization satisfy the equation:

$$V_{AC}(t) = V_0 \sum_{k=1}^{4} \frac{2(-1)^k}{k^2 m(1-m)\pi^2} \sin(k(1-m)\pi)\sin(k\omega t).$$

The interval of the values of m to be removed [0 5−δ4, 0.5+δ4] is illustrated in FIG. 10 and designated by the reference 202.

FIG. 11 illustrates the effect of the variation of m on the asymmetry of the discharge for a plasma configuration in which the gas is argon subject to a pressure equal to 400 mTorrs and the waveform is a waveform modulated by the parameter m for which the number of harmonics is equal to 4 and the peak-to-peak voltage Vpp is equal to 200V.

A first curve 212 illustrates the time-dependent change of the voltage ratio through the sheath close to the first powered electrode 24 and of the voltage through the sheath facing the second grounded electrode 26, $\Delta V_p/\Delta V_g$, as a function of the parameter m.

A second curve 214 illustrates the time-dependent change in the absolute value of the ratio of the ion flows at the same electrodes, $|\Gamma_{ip}/\Gamma_{ig}|$ As expected, the effect for m'=1−m is opposite to that of m. Further, when m approaches 0.5 through a lower or greater value, the asymmetry decreases. Thus, the analytic expression described in the equation of the waveforms of the fifth embodiment is a means for continuously varying the discharge asymmetry.

It should be noted that the asymmetry does not decrease when m increases from 0 to 0.1. This comes from the fact that the negative slope does not change significantly while the positive slope becomes gentler and therefore the sharp rises are limited. The effect is then roughly linear when 0.1<m<0.9.

According to FIG. 12, the respective ratios of the ion flows at the electrode supplied with energy and at the grounded electrode $|\Gamma_{ip}/\Gamma_{ig}|$, are illustrated for the ions $H^+$, $H_2^+$, $H_3^+$ and for a plasma configuration in which the gas is dihydrogen and the waveform is the non-optimized waveform 102 with four frequencies of FIG. 9 with a peak-to-peak voltage Vpp equal to 200V.

According to FIG. 13, the ratios of ion flows between $H_3^+$ and $H^+$, and between $H_3^+$ and $H_2^+$ on each electrode are illustrated for the same plasma configuration as the one of FIG. 12.

FIGS. 12 and 13 thus show that when several chemical species are present in the plasma, such as for example the $H_2^+$, $H_3^+$, $H^+$ species for hydrogen gas, it may be advantageous to generate species close to an electrode if these species are both highly reactive, in the sense that they can only cover a small distance before disappearing while generating other species, and beneficial to the treatment process taking place on the electrode. Conversely, it may be useful to only generate species far from an electrode in the case when the latter would be not very reactive and would act to the detriment of the process taking place on said electrode. It may then be assumed that their density would be smaller in proximity to the electrode.

Generally, a method according to the invention for generating an ion flow asymmetry in a capacitively coupled RF plasma reactor, containing a gas under pressure P, and including a first electrode, supplied with radiofrequency energy, and a second electrode grounded, comprises a step for energizing the first electrode with a radiofrequency voltage waveform having a lower frequency corresponding to a fundamental harmonic of the waveform.

The voltage waveform standardized in amplitude and in time is an approximate waveform with a degree of approximation of a sawtooth RF radiofrequency function standardized in amplitude and in time.

The standardized sawtooth radiofrequency function has a periodic pattern of a fundamental period consisting in a first linear portion of time development of the voltage standardized with a first slope p1, immediately followed by a second linear portion of time development of the standardized voltage with a second slope p2, the first and second slopes being of different amplitudes and of opposite signs, the minimum and the maximum of the pattern having the same unit amplitude.

The degree of approximation of the approximate waveform and the pressure P of the gas are sufficient for causing appearance of an asymmetry of the ion flows between the ion flow at the first electrode and the ion flow at the second electrode.

The smallest absolute value from among the absolute value of the first slope p1 and the absolute value of the second slope p2 is less than or equal to a value equal to 3.8 preferably less than or equal to 2.5, and further more preferably less than or equal to 2.

The approximation degree of the approximate waveform is equal to the reciprocal of a functional distance d separating the standardized approximate voltage waveform and the sawtooth radiofrequency function $f_{saw}(u)$ standardized, the functional distance being comprised in the set formed by the functional distances $L^p$ of Lebesgue.

The functional distance d1 and the functional distance d∞, separating the standardized approximate waveform and the standardized sawtooth radiofrequency function, are respectively defined by the analytical expressions:

$$d1(f(u); f_{SAW}(u)) = \int_0^1 |f(u) - f_{SAW}(u)| \cdot du,$$

$$d\infty(f(u); f_{SAW}(u)) = \max_{u \in [0,1]} (|f(u) - f_{SAW}(u)|)$$

wherein u is the standardized variable defined by u=ωt/2π, f(u) is the standardized representation of the approximate waveform, and $f_{SAW}(u)$ is the standardized representation of the associated sawtooth function.

When the distance d∞ is used, d∞(f(u); $f_{SAW}(u)$) is less than or equal to 0.8, preferably less than or equal to 0.5, this distance being equal to 0.4 when the approximate waveform and the associated sawtooth function respectively are the first non-optimized waveform 102 after standardization of FIG. 9 and the associated sawtooth function 184 after standardization of FIG. 9. Correspondingly, the degree of approximation is greater than or equal to 1.25, preferably greater than or equal to 2.

When the distance d1 is used, d1(f(u); $f_{SAW}(u)$) is less than or equal to 0.5, preferably less than or equal to 0.2.

FIG. 14 is an example giving the possibility of viewing a functional distance d1 separating the first non-optimized waveform 102 after standardization of FIG. 9 and the associated sawtooth function 184 after standardization of FIG. 9.

The functional distance d1 separating the first non-optimized and standardized waveform 102, and the standardized sawtooth function 184 is defined by the analytical expression:

$$d1(f(u); f_{SAW}(u)) = \int_0^1 |f(u) - f_{SAW}(u)| \cdot du,$$

wherein u is the standardized variable defined by u=ωt/2π, f(u) is the standardized representation of the first non-optimized waveform, and $f_{SAW}(u)$ is the standardized representation of the associated sawtooth function.

In this case, the sum of the differential areas of the zones 292, 294, 296, 298, hatched with lines and contained between the curves 102 and 184 when u varies over a unit length, represents the distance d1(f(u); $f_{SAW}$(u)).

It may be observed that with this geometrical representation, with reference to FIG. 9, is clearly appears that the first optimized waveform is closer to the sawtooth function than is the first non-optimized waveform.

Thus, simulations of plasmas has shown the efficiency of the method according to the invention with two different chemistries, one relating to an argon plasma, the other one relating to a hydrogen plasma.

On the other hand, experiments conducted on silicon deposits via a plasma route by using both forms of signals have proved as for them the feasibility of this method.

The criteria of good performances of a deposit made on a substrate are the following:
rapid deposition on the substrate, i.e. a large ion flow,
low bombardment energy of the ions arriving on the substrate;
low deposition rate on the electrode opposite to the one close to the substrate for reducing the cleaning frequency and better use of the gases.

The method according to the invention gives the possibility of meeting these criteria as opposed to conventional plasma deposition methods.

Indeed, the high frequency used alone gives the possibility of certainly increasing the deposition rate at the respective levels of both electrodes but in the same way on both electrodes. The amplitude asymmetry certainly gives the possibility of reducing the ion bombardment energy on the substrate but the deposition rate will be higher on the other electrode, opposite to the electrode close to the substrate.

The same distinctive advantages are obtained for surface etching or treatment by plasma by replacing the deposition rate by the etching rate or the surface treatment rate, respectively.

The invention claimed is:

1. A method for generating an ion flow asymmetry in a capacitively coupled radiofrequency plasma reactor, the plasma reactor containing one or several mixed gases under a total pressure P, and including a first electrode, supplied with radiofrequency energy, and a second electrode, wherein the method comprises:
a step for energizing the first electrode with a periodic radiofrequency voltage waveform V(t) having a lower frequency corresponding to a fundamental harmonic of a fundamental period T of the waveform;
wherein
the voltage waveform standardized in time and in amplitude over an interval [−1; 1], f(u) is an approximate waveform with a degree of approximation of a standardized sawtooth radiofrequency function $f_{SAW}$(u), u being the standardized time defined as a ratio of time t over the fundamental period T, and
the standardized sawtooth radiofrequency function has a periodic pattern of the fundamental period T consisting in a first linear portion of a time development of the standardized voltage with a first slope p1, immediately followed by a second linear portion of the time development of the standardized voltage with a second slope p2, the first and second slopes having different amplitudes and opposite signs, a minimum and a maximum of the pattern having the same unit amplitude; and
the degree of approximation of the approximate waveform and the total pressure P of the gas or the mixed gases are sufficiently high so as to cause appearance of an asymmetry of the ion flows between the ion flow at the first electrode and the ion flow at the second electrode.

2. The method of claim 1, wherein the smallest absolute value from among an absolute value of the first slope p1 and an absolute value of the second slope p2 is less than or equal to 3.8, and preferably less than or equal to 3.

3. The method of claim 1, wherein
the periodic radiofrequency voltage waveform V(t) is differentiable and has a slope asymmetry measured by a slope asymmetry factor F parameterized by an integer p greater than or equal to 1 and defined by equation:

$$F(p) = \left| \frac{\int_{t\in[0,T],V'>0} |(V'(t))^p| - \int_{t\in[0,T],V'<0} |(V'(t))^p|}{\int_{t\in[0,T]} |(V'(t))^p|} \right|$$

where V'(t) designates a derivative of the waveform at an instant t, and
F(p) is greater than or equal to a threshold, wherein the threshold depends on the integer p and is equal to 0.1 when p is equal to 2.

4. The method of claim 1, wherein the total pressure P of the gas or of the mixed gases is greater than or equal to a threshold pressure value Ps(gas), depending on the nature of the gas, wherein the threshold pressure is defined as the pressure above which an asymmetry of the ion flow clearly appears between the ion flow at the first electrode and the ion flow at the second electrode, when the standardized waveform is a standardized sawtooth function for which the absolute value of the gentlest slope is equal to 2.5 or the slope asymmetry factor F(2) of the waveform V(t) is greater than or equal to 0.1.

5. The method of claim 1, wherein the gas is suitable for depositing materials on, for etching, and for modifying a substrate, and wherein the gas is selected from the group consisting of argon, dihydrogen, $O_2$, $Cl_2$, HBr, $CF_4$, $C_4F_8$, $CHF_3$, CO, $SiH_4$, $SiCl_4$, $SiF_4$, $CH_4$, $C_2H_6$ and the carbonaceous chains of same structures, $SF_6$, $Si_2H_6$, $SiH_xF_{4-x}$, $GeH_4$, $GeF_4$, $GeH_xF_{4-x}$, $CCl_4$, $CCl_3F$, $CCl_2F_2$, $CF_3Cl$, $C_2F_6$, $C_3F_8$, $C_5F_8$, $C_5F_{12}$, $CHF_3$, $BCl_3$ and the value of the pressure threshold is equal to 100 mTorrs when the gas is argon.

6. The method of claim 1, wherein
the degree of approximation of the approximate waveform is equal to a reciprocal of a functional distance d separating the standardized approximate voltage waveform f(u) and the standardized sawtooth radiofrequency function $f_{saw}$(u), the functional distance being comprised in the set formed by the functional distances $L^p$ of Lebesgue,
the degree of approximation being greater than or equal to 1.25, preferably greater than or equal to 2 when the functional distance d is the functional distance d∞, separating the standardized approximate waveform and the standardized sawtooth radiofrequency function, defined by the analytical expression:

$$d\infty(f(u); f_{SAW}(u)) = \max_{u\in[0,1]} (|f(u) - f_{SAW}(u)|)$$

wherein u is the standardized variable defined by u=ωt/2π.

7. The method of claim 1, wherein the approximate voltage waveform after standardization f(u) is a non-invariant waveform by time reversal, i.e. a waveform for which no real constant τ exists which satisfies:

f(u)=f(τ−u), u designating the standardized time development variable of the standardized approximate voltage waveform.

8. The method of claim 1, wherein for each current maximum of the standardized approximate voltage waveform identified by a travel index j, a duration separating an instant of occurrence t(max(j)) of the current maximum of the instant of occurrence t(min(j)) of the first minimum min(j) according to the current maximum max(j), is different from the duration separating the instant of occurrence t(max(j+1)) of the first maximum max(j+1) immediately following the first minimum min(j) and the instant of occurrence t(min(j)) of the first minimum min(j).

9. The method of claim 1, wherein the approximate waveform before being standardized is equal to a development of a truncated series approximating a sawtooth function limited to an integer number n of first harmonic frequencies, and described by the equation:

$$V_{AC}(t) = V_0 \sum_{k=1}^{n} \frac{2(-1)^k}{k^2 m(1-m)\pi^2} \sin(k(1-m)\pi)\sin(k\omega t),$$

$V_0$ being an adjusted voltage factor for obtaining a desired peak voltage $V_{pp}$, the number of the first harmonic frequencies n of the development of the series is greater than or equal to 2, ω being the angular frequency corresponding to the fundamental frequency, and m being a real parameter comprised between 0 and 1, the values m belonging to an interval [0.5−δ4 0.5+δ4] being excluded, δ4 being greater than or equal to 0.1, preferably greater than or equal to 0.2.

10. The method of claim 1, wherein the approximate waveform before being standardized is equal to a development of a truncated series approximating a sawtooth function limited to an integer number n of first harmonic frequencies, and described according to the equation:

$$V_{AC}(t) = V_0 \sum_{k=1}^{n} \frac{1}{k} \cos(k\omega t + \Phi),$$

$V_0$ being an adjusted voltage factor for obtaining a desired peak voltage $V_{pp}$, the number of the first harmonic frequencies n of the development of the series being greater than or equal to 2, ω being the angular frequency corresponding to the fundamental frequency, and Φ being a phase shift common to the harmonics comprised in the union of intervals $$\left[\frac{\pi}{2} - \delta 3, \frac{\pi}{2} + \delta 3\right] \text{ and } \left[\frac{3\pi}{2} - \delta 3, \frac{3\pi}{2} + \delta 3\right]$$

with δ3 less than or equal to π/4, preferably less than or equal to π/6, and even more preferably less than or equal to π/8.

11. The method of claim 1, wherein the approximate waveform before being standardized is equal to a development of a truncated series approximating a sawtooth function limited to an integer number n of first harmonic frequencies, and described by the equation:

$$V_{AC}(t) = V_0 \sum_{k=1}^{n} \frac{n-k+1}{n} \cos(k\omega t + \Phi),$$

$V_0$ being an adjusted voltage factor for obtaining a desired peak voltage $V_{pp}$, the number of the first harmonic frequencies n of the development of the series being greater than or equal to 2, ω being the angular frequency corresponding to the fundamental frequency, and Φ being a phase shift common to the harmonics comprised in the union of intervals $$\left[\frac{\pi}{2} - \delta 2, \frac{\pi}{2} + \delta 2\right] \text{ and } \left[\frac{3\pi}{2} - \delta 2, \frac{3\pi}{2} + \delta 2\right]$$

with δ2 less than or equal to π/4, preferably less than or equal to δ/6, and even more preferably less than or equal to δ/8.

12. The method of claim 1, wherein the approximate waveform before standardization is equal to a development of a truncated series approximating the sawtooth function limited to an integer number n of first harmonic frequencies, the number of harmonics being greater than or equal to 3, preferably equal to 4.

13. The method of claim 1, wherein the first and second slopes p1, p2 and/or a parameter m are adjusted by a feedback loop used for obtaining a desired voltage waveform at the first electrode supplied with energy.

14. A plasma treatment method for a substrate in a capacitively coupled plasma reactor, wherein the plasma reactor contains a gas under pressure P, and includes a first electrode, supplied with radiofrequency energy, and a second electrode, the method comprising
a step for setting a substrate to be treated in proximity to an electrode from among the first electrode and the second electrode; and
a step for generating an ion flow asymmetry defined by claim 1.

15. The method of claim 14, wherein the gas used makes it possible to generate several chemical species which are either highly reactive, or not very reactive, and
the waveform of the energization voltage is adjusted so as to:
either move the generation of the reactive species closer to an electrode when they are beneficial to the treatment of the substrate, or
move away the species which are not very reactive and which act detrimentally to the treatment of the substrate.

16. The method of claim 14, wherein the plasma is used for deposition on a substrate, etching a substrate, or modifying a surface of a substrate.

17. A plasma treatment system for generating an ion flow asymmetry comprising:
a capacitively coupled radiofrequency plasma reactor, containing a gas or mixed gases under a total pressure P, wherein the plasma reactor includes a first electrode supplied with radiofrequency energy and a second electrode, and
means for adjusting the total pressure P of the gas or of the mixed gases; and a voltage waveform generator, connected to the first electrode through a coupling capacitor, configured for generating a periodic radiofrequency voltage waveform V(t) having a lower frequency corresponding to a fundamental harmonic of the waveform of fundamental period T;

wherein a standardized voltage waveform in time and in amplitude on an interval [−1; 1], f(u) is an approximate waveform with a degree of approximation of a standardized sawtooth radiofrequency function $f_{SAW}(u)$, u being a standardized time defined as the ratio of the time t over the fundamental period T, and the standardized sawtooth radiofrequency function $f_{SAW}(u)$ has a periodic pattern of fundamental period T consisting in a first linear portion of time-dependent change in the standardized voltage with a first slope p1, immediately followed by a second linear portion of time-dependent change of the standardized voltage with a second slope p2, the first and second slopes being of different amplitudes and of opposite signs, a minimum and a maximum of the pattern having the same unit amplitude; and the degree of approximation of the approximate waveform and the total pressure P of the gas or of the mixed gases are sufficient for causing appearance of an asymmetry of the ion flows between the ion flow at the first electrode and the ion flow at the second electrode.

18. The system of claim 17, wherein the means for adjusting the total pressure P of the gas or of the mixed gases and the voltage waveform generator are configured for applying the method of claim 2.

19. The system of claim 17, wherein the second electrode is grounded or is at a floating potential.

* * * * *